(12) United States Patent
Chen et al.

(10) Patent No.: US 10,833,472 B1
(45) Date of Patent: Nov. 10, 2020

(54) WAVELENGTH LOCKER

(71) Applicant: Acacia Communications, Inc., Maynard, MA (US)

(72) Inventors: Long Chen, Marlboro, NJ (US); Christopher Doerr, Middletown, NJ (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 16/285,912

(22) Filed: Feb. 26, 2019

Related U.S. Application Data

(63) Continuation of application No. 15/851,474, filed on Dec. 21, 2017, now Pat. No. 10,263,385.

(60) Provisional application No. 62/437,141, filed on Dec. 21, 2016.

(51) Int. Cl.
| | | |
|---|---|---|
| *H01S 3/106* | (2006.01) | |
| *H01S 3/13* | (2006.01) | |
| *H01S 3/131* | (2006.01) | |
| *H01S 3/00* | (2006.01) | |
| *H01S 5/068* | (2006.01) | |

(52) U.S. Cl.
CPC .......... *H01S 3/1305* (2013.01); *H01S 3/0014* (2013.01); *H01S 3/1062* (2013.01); *H01S 3/1317* (2013.01); *H01S 5/06821* (2013.01)

(58) Field of Classification Search
CPC .. H01S 3/1305; H01S 5/06821; H01S 3/1062; H01S 3/0014; H01S 3/1317
See application file for complete search history.

(56) References Cited

U.S. PATENT DOCUMENTS

| | | | | |
|---|---|---|---|---|
| 7,565,045 | B2 * | 7/2009 | Suzuki | H01S 5/0687 |
| | | | | 385/27 |
| 8,923,352 | B2 * | 12/2014 | Strandjord | G01C 19/727 |
| | | | | 356/213 |
| 9,608,406 | B1 * | 3/2017 | Lee | H01S 5/0612 |
| 9,653,882 | B1 * | 5/2017 | Zheng | H01S 5/142 |
| 2008/0193145 | A1 * | 8/2008 | Yokoyama | H01S 5/02248 |
| | | | | 398/200 |
| 2012/0105177 | A1 * | 5/2012 | McLaren | H01P 1/2084 |
| | | | | 333/234 |
| 2014/0044142 | A1 * | 2/2014 | Strandjord | H01S 3/1303 |
| | | | | 372/32 |
| 2014/0376001 | A1 | 12/2014 | Swanson | |
| 2015/0277053 | A1 * | 10/2015 | Zheng | G02F 1/3132 |
| | | | | 385/31 |
| 2015/0311672 | A1 | 10/2015 | Chaouch | |
| 2016/0131844 | A1 * | 5/2016 | Yang | G02B 6/29395 |
| | | | | 359/330 |
| 2018/0100967 | A1 | 4/2018 | Parker et al. | |
| 2019/0044300 | A1 * | 2/2019 | Takabayashi | G02B 6/4215 |
| 2019/0199057 | A1 * | 6/2019 | Wen | H01S 5/0078 |

* cited by examiner

*Primary Examiner* — Yuanda Zhang
(74) *Attorney, Agent, or Firm* — Joseph D'Angelo

(57) ABSTRACT

An apparatus and method for calculating the frequency of the light.

13 Claims, 5 Drawing Sheets

WAVELENGTH LOCKER

CROSS REFERENCE TO RELATED APPLICATIONS AND PRIORITY CLAIM

The present application is a continuation claiming the benefit under 35 U.S.C. § 120 of U.S. patent application Ser. No. 15/851,474, filed on Dec. 21, 2017 entitled "WAVELENGTH LOCKER" which is incorporated herein by reference in its entirety, which claims the benefit under 35 U.S.C. § 119(e) of U.S. Patent Application Ser. No. 62/437,141, filed Dec. 21, 2016 and entitled "INTEGRATED WAVELENGTH LOCKER USING A 90-DEGREE HYBRID," which is hereby incorporated herein by reference in its entirety.

BACKGROUND

In telecommunications, the amount of information that can be sent over a single optical fiber can be increased by sending information using multiple optical signals, each with a different wavelength. A WDM can be used at a transmitting end of the optical fiber to combine light from a group of optical fibers into the single optical fiber. On the receiving end of the optical fiber, another WDM can be used to demultiplex the multiple optical signals into another group of optical fibers.

SUMMARY

An apparatus and method for calculating the frequency of the light.

BRIEF DESCRIPTION OF THE FIGURES

Various aspects and embodiments of the application will be described with reference to the following example embodiments. It should be appreciated that the figures are not necessarily drawn to scale.

DETAILED DESCRIPTION

Figure 1:
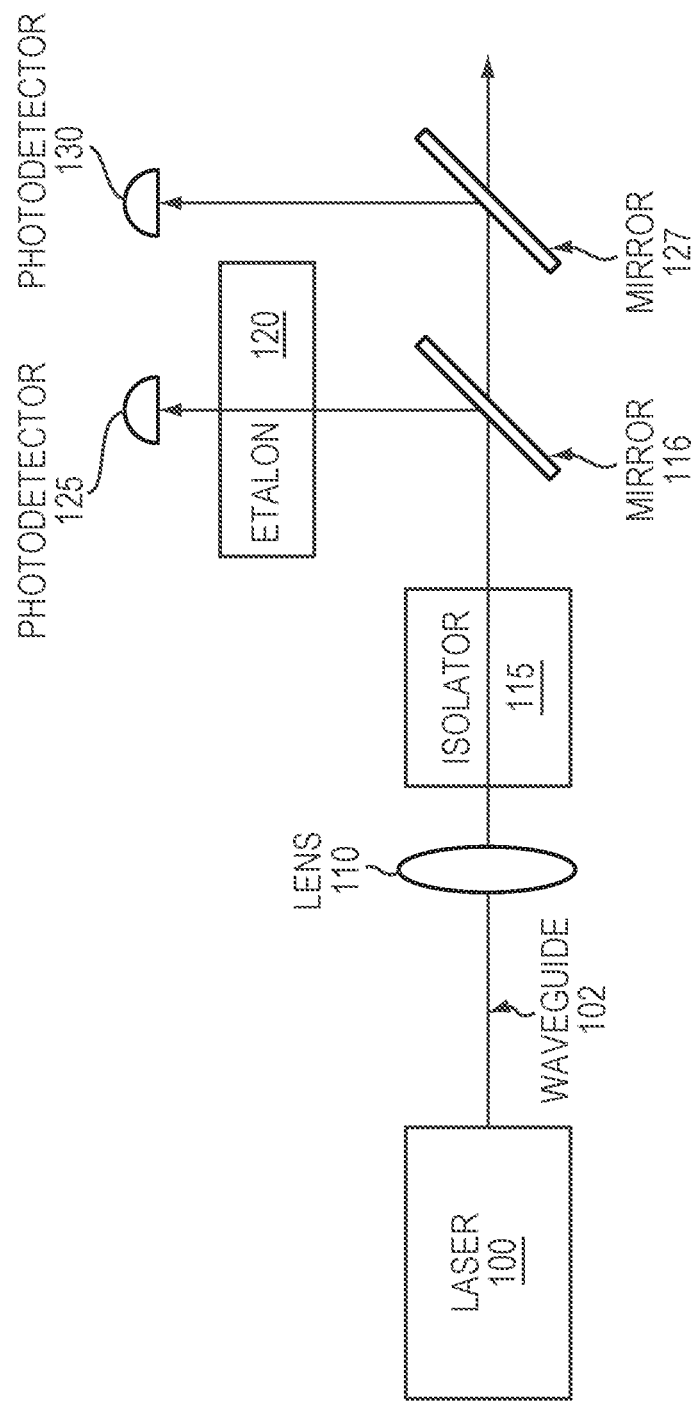
FIG. 1 is an example embodiment of a etalon, according to an embodiment of the current disclosure.

In many embodiments, it may be necessary to tune a tunable laser to a specific wavelength. In most embodiments, a laser may be able to output different wavelengths of light, and the wavelength of any outputted light may influenced by temperature and distortion from different components of the laser. Conventionally, tunable lasers may have included a wavelength locker. A typical required frequency stability at the end of life is +/−1.8 GHz. Typically, a wavelength locker may have consisted of an etalon or optical interferometer followed by a photodetector. Usually, output light from a laser might pass through an etalon with a free spectral range equal to (or twice of) that of channel spacing for a laser. Generally, an etalon used for wavelength locking needs to be very precise, and the free-spectral range of the etalon response has to align relatively precisely to the channels in a grid for the system (most etalon-based lockers generally use thermal tuning for some correction).

Conventionally, part of the output light of a laser may be split off and pass through an etalon and enter a photodetector. Usually, there may be a second photodetector monitoring light that did not pass through the etalon or was reflected from the etalon. Generally, as a wavelength of light from a laser changes, transmission to an etalon will change. Typically, when a wavelength is in the middle of its slope then the two photodetectors are at the same current and it is possible to lock the laser at a same wavelength. Usually, after a wavelength has been locked, if the photodetectors are or become imbalanced, there has been a shift in wavelength of a laser and it may be necessary to adjust the laser based on the temperature of the substrate or otherwise tune the laser.

In most embodiments, the current disclosure has recognized that using an etalon and photodetectors may require many discrete parts, where those parts may need to be precisely spaced. Generally, an etalon has multiple pieces of glass including two mirrors and a cavity precise. Typically, the spacing of an etalon needs to line up exactly with the channels but may have temperature dependence and may have chromatic dispersion. Usually, measurements from an etalon are Lorentzian in shape with respect to wavelength of light passing through the etalon.

In most embodiments, the current disclosure has recognized that there may be benefits to making an integrated wavelength locker in silicon. In many embodiments, the current disclosure has realized that there may be difficulties measuring wavelength in a device incorporated in silicon. In certain embodiments, the current disclosure has realized that silicon may be temperature dependent. In further embodiments, the current disclosure has realized that silicon may also have chromatic dispersion, which may cause misalignment with channels. In some embodiments, silicon may have a temperature dependence of 0.1 nm per degree Celsius for a filter. In many embodiments, a silicon filter may have chromatic dispersion and thus may not be able to line up with channels which have a constant frequency spacing over a large range.

In many embodiments, the current disclosure may enable measurement of a wavelength of a laser in silicon while accounting for changes in temperature and dispersion. In certain embodiments, a wavelength locker may be integrated on a photonic integrated circuit (PIC). In most embodiments, a wavelength locker for use in a tunable laser may comprise a Mach-Zehnder interferometer (MZI) and 90-degree optical hybrid integrated on a photonic integrated circuit. In some embodiments, the current disclosure may integrate a temperature sensor near a wavelength locker or filter to measure temperature. In some embodiments herein, a wavelength filter may be referred to as an optical device. In certain embodiments, a MZI may be referred to herein as an optical device.

In many embodiments, periodicity of a filter may not be locked to channels, where misalignment to the channels may be corrected via digital processing. In some embodiments, a wavelength locker may not need to be accurately set to a channel spacing of an optical device. In certain embodiments, a wavelength locker may not require a filter set to a desired channel grid, which may avoid high precision, low dispersion and temperature-insensitive designs which may make the wavelength locker challenging to integrate with a PIC. In some embodiments, a wavelength locker may not need to be on a channel spacing and instead may be accurate as a result of electronic processing of a signal output from a wavelength locker. In most embodiments, frequency measurement may be used in a feedback loop to set the laser to a desired frequency or wavelength.

In certain embodiments, a wavelength locker may have a relatively low temperature dependence, which may facilitate suitable wavelength-locking functionality. In some embodiments, a wavelength locker or filter may measure the phase of light to determine wavelength. In many embodiments, using a wavelength locker or filter in silicon to measure phase of light may provide a linear response with respect to wavelength. In some embodiments, the current disclosure may move accuracy and control of a wavelength measurement from optics to digital electronics.

In certain embodiments, a wavelength locker may include a filter with a length-imbalanced Mach-Zehnder interferometer (MZI) with an optical 90-degree hybrid. In some embodiments, a wavelength locker may include photodetectors coupled to outputs of a 90-degree hybrid. In most embodiments, a wave locker may include a pair of analog to digital converters coupled to receive I and Q signals from a 90 degree hybrid. In many embodiments, a wavelength locker may also include a processor. In some embodiments, a wavelength locker may be co-located with a temperature sensor.

In most embodiments, a filter of a wavelength locker may not need to line up with periodicity of channels to measure the wavelength of light. In most embodiments, output of a wavelength locker may be processed by a processor to determine wavelength of light of a laser. In almost all embodiments, processing of output of a wavelength locker may compensate for inaccuracies in measurements of a wavelength locker. In certain embodiments, a waveguide may be made of silicon nitride. In other embodiments, a waveguide may be formed of glass.

In certain embodiments, an integrated heater may be co-located with a filter or MZI and may be used to keep the filter or MZI at a constant temperature. In alternative embodiments, a temperature sensor may be co-located with a filter or MZI to provide a temperature of the filter or MZI to a processor determining the wavelength. In still further embodiments, an amount of power used in a chip may be used to estimate a temperature of a filter or MZI.

In many embodiments, an optical 90-degree hybrid may be a 2×4 multi-mode coupler. In other embodiments, an optical 90-degree hybrid may be a 2×4 star coupler. In further embodiments, an optical 90-degree hybrid may be an arrangement of 1×2 and 2×2 couplers. In some embodiments, a photodetector pair may be connected to four 90-degree hybrid outputs. In most embodiments, outputs of a 90-degree hybrid are an "I" signal and a "Q" signal.

In certain embodiments, a portion of an output of a tunable laser may be split to a MZI. In many embodiments, a MZI may feed into an optical 90-degree hybrid, which may output an "I" signal and "Q" signal to respective pairs of photodetectors. In almost all embodiments, I and Q outputs may be sent to analog-to digital converters. In many embodiments, a frequency of light may be calculated by the following equation:

$$f = \frac{c_0}{n(f)\Delta L}\left(m + \frac{1}{2\pi}\tan^{-1}\frac{Q}{I}\right)$$

where $c_0$ is the speed of light in a vacuum, $n(f)$ is the refractive index in the MZI as a function of frequency f, $\Delta L$ is the path-length difference in the MZI, and m is an integer. In some embodiments, $n(f)$ and $\Delta L$ may be calibrated when a wavelength locker is first packaged and held at a set temperature by a thermoelectric cooler that holds a laser temperature constant. In other embodiments, $n(f)$ and $\Delta L$ may be calibrated in the manner described above. In some embodiments, m may be determined from coarse tuning settings of a laser obtained during calibration. In certain embodiments, a larger $\Delta L$ may be chosen to be in a design, the larger m may be, which may reduce frequency measurement sensitivity to errors in I and Q. In some embodiments, there may be a temperature sensor near waveguides of a MZI to better know the temperature of the MZI.

In most embodiments, given a wavelength determination of light of a laser, the laser may be tuned to match a particular wavelength. In certain embodiments, a laser may be tuned by increasing a temperature via an integrated heater near the laser. In other embodiments, a laser may be tuned by increasing the cavity length in the laser.

Refer now to the example embodiment of FIG. 1, which illustrates a wavelength locker using an etalon. Laser 100 supplies light into waveguide 102 through lens 110, into isolator 115. Light from laser 100 continues to mirror 116 where a portion of the light reflects to etalon 120 and passes through to photodetector 125. A portion of light from laser passes through mirror 116 to mirror 127. A portion of light from laser 102 bases off mirror 127 and hits photodetector 130 while another portion of the light continues down waveguide 102.

Figure 2:
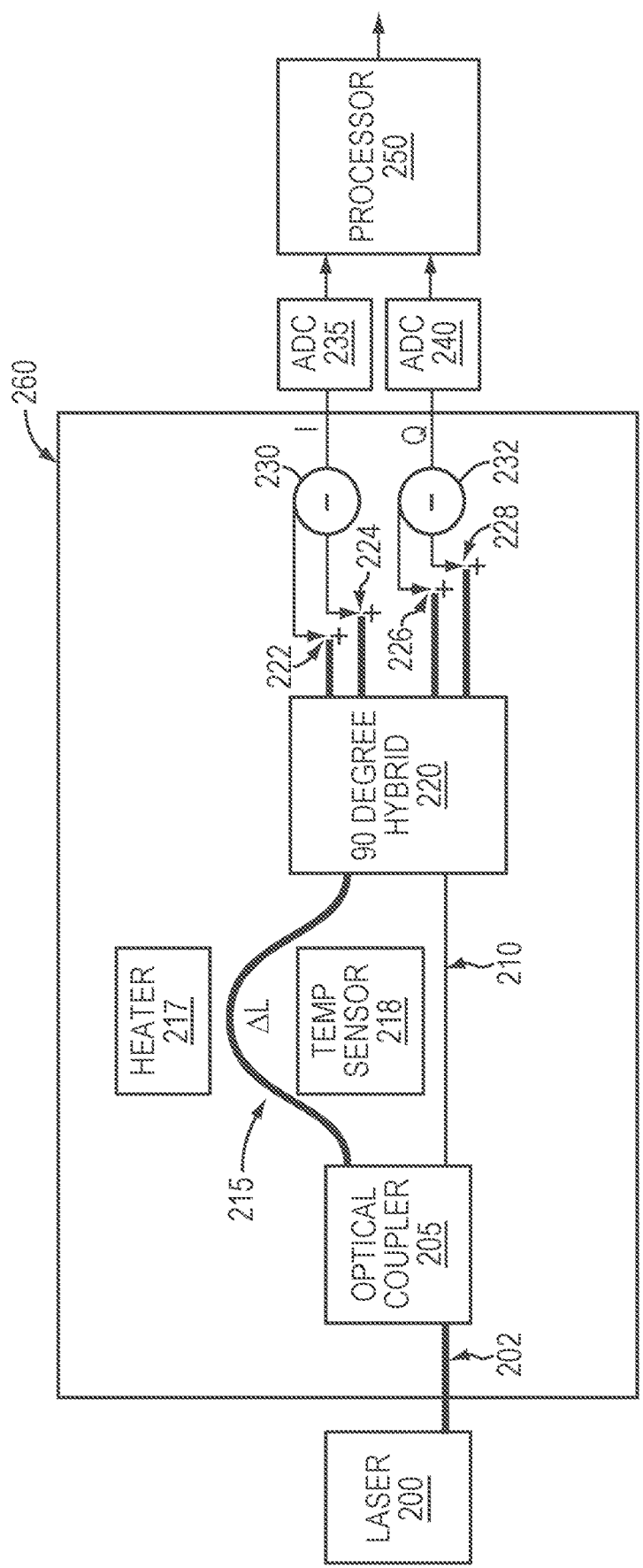
FIG. 2 is a simplified illustration of a Mach-Zehnder interferometer with an optical 90 degree hybrid, according to an embodiment of the current disclosure.

Refer now to the example embodiment of FIG. 2, which illustrates a sample implementation of a Mach-Zehnder Interferometer with a 90 degree hybrid. In FIG. 2, a portion of light of laser 200 is fed into waveguide 202, by capturing a small portion the light of the laser. For simplicity, in this embodiment, laser 200 is shown directly feeding into waveguide 202. The light travels in waveguide 202 to couple 205, which is part of a length imbalanced interferometer that is optically coupled to 90 degree hybrid 220.

In FIG. 2, waveguide 202, optical coupler 205, waveguides 210 and 215, and 90-degree optical hybrid make up a Mach-Zehnder Interferometer (MZI). Heater 217 is located near longer waveguide arm 215 of MZI and temperature sensor 218 is located proximate to MZI. 90 degree hybrid 220 has four outputs, output 222, 224, 226, and 228. Outputs 222 and 224 are inputs into photodiode 230. Outputs 226 and 228 are inputs into photodiode 232. FIG. 260 represents the Mach-Zender Interferometer paired with photodiodes. The outputs of photodiodes 230 and 232 are sent to analog to digital converters 235 and 240 respectively. The output of ADC 235 and ADC 240 are sent to processor 250. Using the following equation processor 250 is able to determine the wavelength of the light based on the determined phase of the light:

$$f = \frac{c_0}{n(f)\Delta L}\left(m + \frac{1}{2\pi}\tan^{-1}\frac{Q}{I}\right)$$

Given a calculation of the wavelength of the light, a laser may be adjusted to match the wavelength of the light to a desired wavelength.

Figure 3:
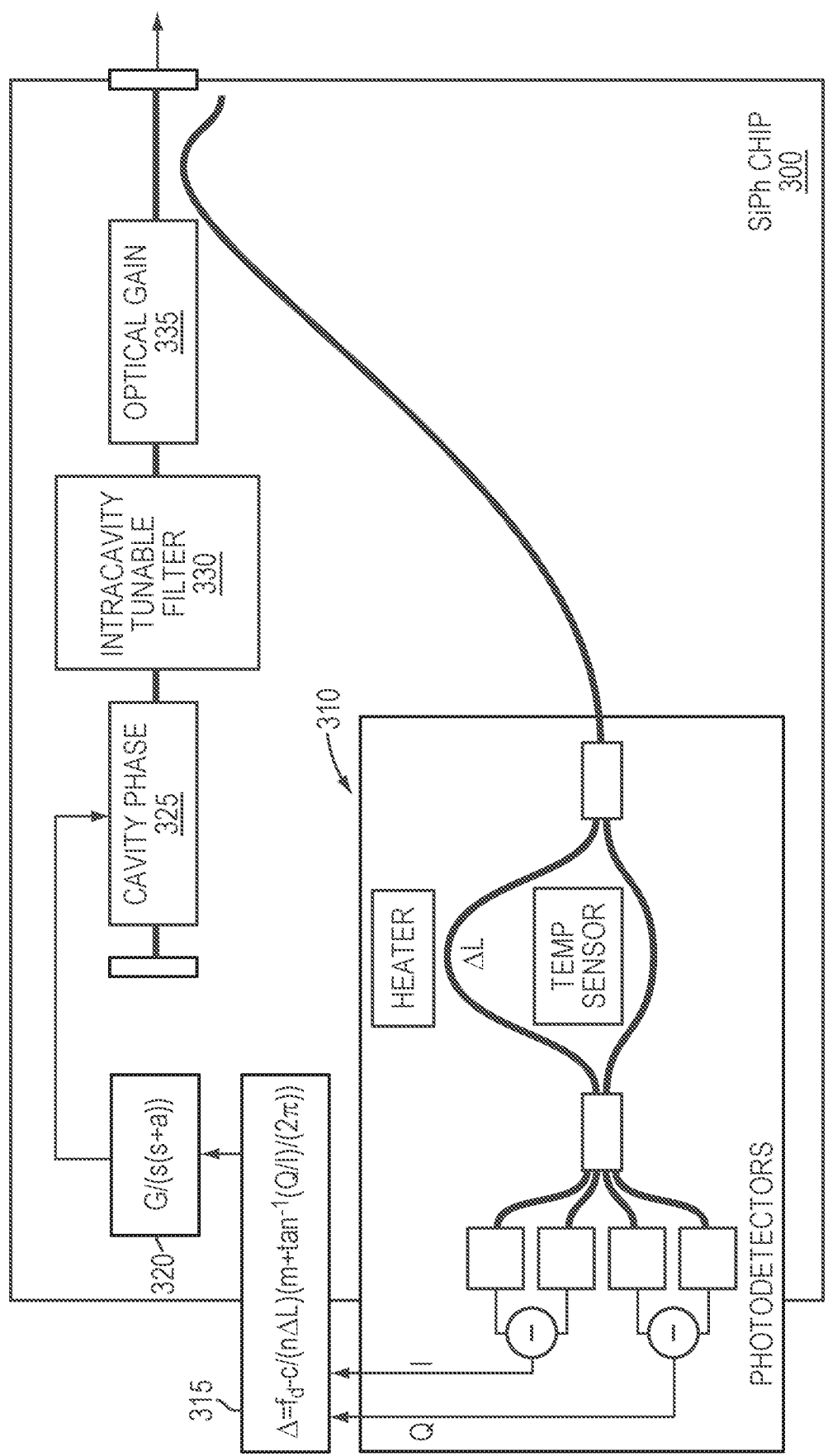
FIG. 3 is a simplified illustration a laser system and control loops for the laser, according to an embodiment of the current disclosure.

Refer now to the example embodiment of FIG. 3, which shows a system including a laser, wavelocker, and control loop for the laser. In the example embodiment of FIG. 3, SiPH Chip 300 has device 310, which roughly mirrors the devices of box 260 of FIG. 2. Output from box 310 are I and Q to box 315. Box 315 represents the equation used to determine the wavelength of the light. Box 320 represents an equation used to control the laser to lock on a particular wavelength. In box 320, G is the gain of the feedback loop, A is a pole of the feedback response, and S is equal to $i2\pi f$, where i is the imaginary number and f is the frequency. This equation may be used to tune the laser by changing cavity phase 325. SiPh chip 300 also has intracavity tunable filter 330 and optical gain 335.

Figure 4:
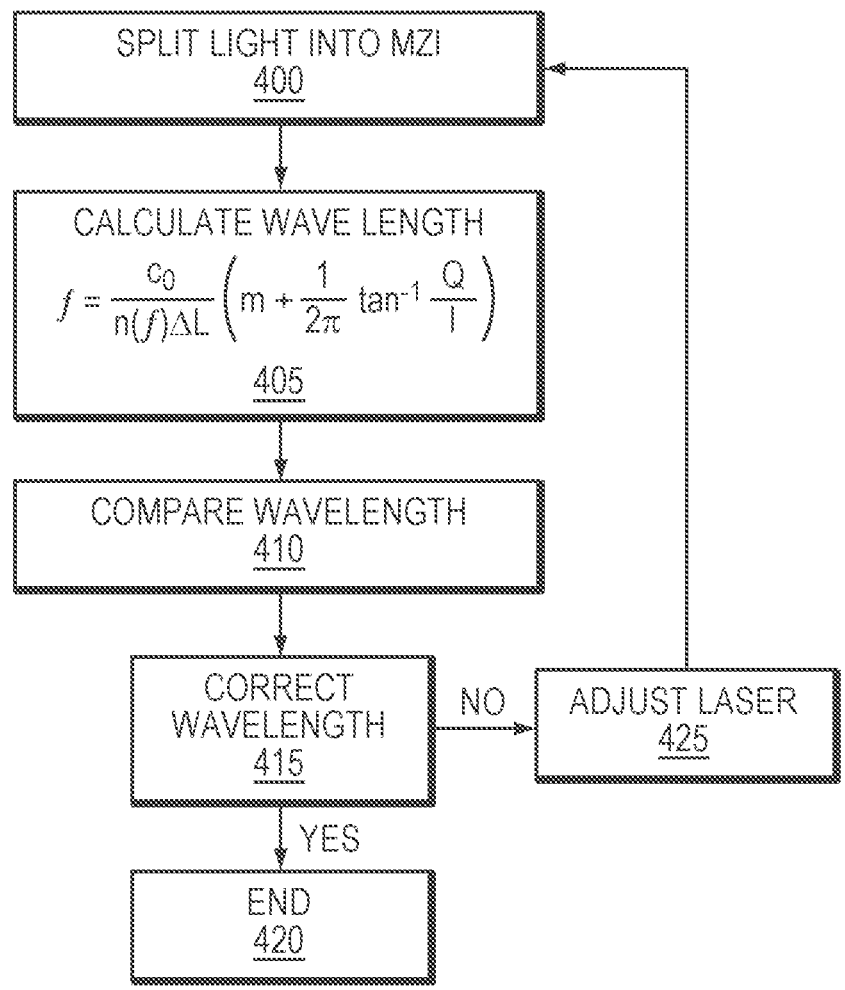
FIG. 4 is a simplified method of tuning a laser, according to an embodiment of the current disclosure.

Refer now to the example embodiment of FIG. 4, which illustrates a sample method for adjusting a wavelength of a laser. In the example embodiment of FIG. 4, light is split into an MZI (step 400). Wavelength of the light is calculated (step 405). The wavelength of light is compared to a desired wavelength (step 410). If the wavelength is the correct wavelength (step 415), then the method may end (step 420). If the wavelength is not the correct wavelength (step 415) then the laser is adjusted (step 425) and the method may be repeated.

In certain embodiments, a wavelength filter of a wavelength locker may be held at a constant temperature for all channels and the wavelength of a laser may be found and may be adjusted by calculation from measuring the in-phase and quadrature responses as measured by four photodiodes after a wavelength filter. In other embodiments, to adjust a temperature of a wavelength filter of a wavelength locker for each channel, a wavelength deviation of a laser is found and subsequently adjusted by subtracting an in-phase only response as measured by two photodiodes after the wavelength filter. In some of the other embodiment, a temperature sensor may be placed next to the wavelength filter. In certain embodiments, a heater may be placed next to a wavelength filter and may be used to set the temperature of the filter. In some embodiments, a filter may be locked at its local temperature and a laser may then be locked to this filter. In some embodiments, a silicon diode may be used for a temperature sensor. In most embodiments, a diode sensor for a temperature sensor with an applied current, a resulting voltage may be temperature dependent.

In certain embodiments, a laser may be tuned by locking on a slope of an wavelength filter according to the wavelength of the laser. In most embodiments, a laser may be tuned to a channel and then a temperature of a wavelength locker may be adjusted using a proximate heater. In certain embodiments, a wavelength filter may be a ring resonator filter. In many embodiments, a calibration procedure may use a precision wavelength meter. In some embodiments, an etalon filter may be used with an integrated temperature sensor.

Figure 5:
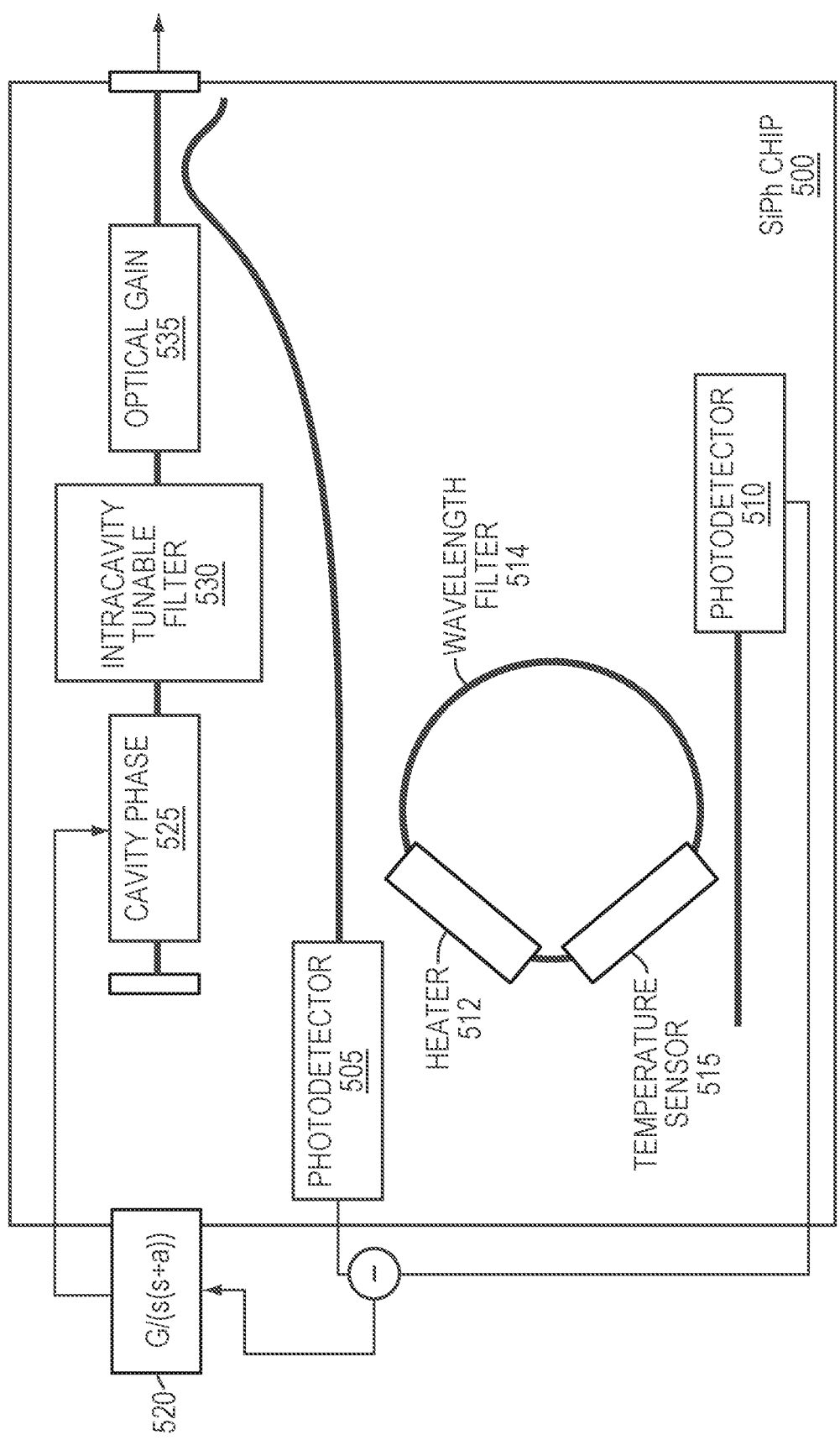
FIG. 5 is an embodiment of an integrated wavelength locker, according to an embodiment of the current disclosure.

Refer now to the example embodiment of FIG. 5, which illustrates a heater 512 and temperature sensor 515 co-located with wavelength filter 514. There are photodetectors 505 and 510. Photodetector 505 measures light passing through the filter, and photodetector 510 measures light dropping from the filter. In this example, the wavelength filter is a ring-resonator add-drop filter. Outputs of photodetectors 505 and 510 are fed to a control system, which is used to tune the laser wavelength. An example control system containing gain G and an integrator and a pole is shown as 520. In a first embodiment using the apparatus of FIG. 5, a wavelength may be set on a laser, and the temperature of the wavelength filter may be adjusted by changing heater 512 to place a slope of the wavelength filter response at a desired wavelength. The laser wavelength is adjusted to make the photocurrents from photodetectors 505 and 510 equal. The laser wavelength may be adjusted by adjusting cavity phase 525, for example.

In many embodiments, methods of the current disclosure may be performed on a processor. In certain embodiments, there may be multiple processors on a silicon chip. In some embodiments, a processor may be located outside of a silicon chip.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within +10% of a target value in some embodiments, within +5% of a target value in some embodiments, and yet within +2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The terms "approximately" and "about" may be used to mean within ±20% of a target value in some embodiments, within 10% of a target value in some embodiments, within ±5% of a target value in some embodiments, or within 2% of a target value in some embodiments. The terms "approximately" and "about" may include the target value.

What is claimed is:

1. An apparatus comprising:
   a silicon photonics chip with a wavelength filter, a heater and a temperature sensor; wherein the wavelength filter is a ring-resonator add drop filter; wherein the temperature sensor and heater are placed proximate to the wavelength filter; wherein the temperature sensor is enabled to read the temperature of the wavelength filter; wherein a first photodetector is optically coupled to the ring resonator add drop filter and enabled measure light passing through the ring-resonator add-drop filter; wherein a second photodetector is optically coupled to the add drop filter and enabled measure light dropping from the filter; wherein the heater is enabled to change the temperature of the wavelength filter to change a wavelength of the filter; and
   a control system; wherein the output of the first photodetector is connected to the control system; wherein the output of the second photodetector is connected to the control system; wherein the control system has logic to tune a laser to make output photocurrents from the first and second photodetector to be equal.

2. The apparatus of claim 1 wherein the temperature sensor is a diode sensor.

3. The apparatus of claim 1 wherein the silicon photonics chip has a set of photodetectors; wherein a first photodetector of the set of photodetectors is optically coupled to the filter to measure light passing through the filter.

4. The apparatus of claim 3 wherein a second photodetector of the set of photodetectors measures light dropping from the filter.

5. The apparatus of claim 1 wherein the silicon photonics chip further has a control system and output of the first photodetector and the second photodetector is fed to the control system.

6. The apparatus of claim 5 wherein the output of the control system is enabled to control the wavelength of a laser.

7. A system comprising:
   a laser; and
   a silicon photonics chip with a wavelength filter, a heater and a temperature sensor; wherein the wavelength filter is a ring-resonator add drop filter; wherein the temperature sensor and heater are placed proximate to the wavelength filter wherein the temperature sensor is enabled to read the temperature of the wavelength filter; wherein a first photodetector is optically coupled to the ring resonator add drop filter and enabled measure light passing through the ring-resonator add-drop filter; wherein a second photodetector is optically coupled to the add drop filter and enabled measure light dropping from the filter wherein the heater is enabled to change the temperature of the wavelength filter to change a wavelength of the filter; and
   a control system; wherein the output of the first photodetector is connected to the control system; wherein the output of the second photodetector is connected to the control system; wherein the control system has logic to tune the laser to make output photocurrents from the first and second photodetector to be equal.

8. The system of claim 7 wherein the temperature sensor is a diode sensor.

9. The system of claim 7 wherein the filter is a ring-resonator add-drop filter.

10. The system of claim 7 wherein the silicon photonics chip has a set of photodetectors; wherein a first photodetector of the set of photodetectors is optically coupled to the filter to measure light passing through the filter.

11. The system of claim 7 wherein a second photodetector of the set of photodetectors measures light dropping from the filter.

12. The system of claim 7, wherein the silicon photonics chip further has a control system and output of the first photodetector and the second photodetector is fed to the control system.

13. The system of claim 7, wherein the output of the control system is enabled to control the wavelength of the laser.

* * * * *